United States Patent
Hellberg

(10) Patent No.: US 9,577,584 B2
(45) Date of Patent: Feb. 21, 2017

(54) AMPLIFIER CIRCUIT AND METHOD

(71) Applicant: Telefonaktiebolaget L M Ericsson (publ), Stockholm (SE)

(72) Inventor: Richard Hellberg, Huddinge (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 137 days.

(21) Appl. No.: 14/406,799

(22) PCT Filed: May 8, 2014

(86) PCT No.: PCT/SE2014/050566
§ 371 (c)(1),
(2) Date: Dec. 10, 2014

(87) PCT Pub. No.: WO2015/171027
PCT Pub. Date: Nov. 12, 2015

(65) Prior Publication Data
US 2016/0218680 A1    Jul. 28, 2016

(51) Int. Cl.
*H03F 3/68*   (2006.01)
*H03F 1/02*   (2006.01)
(Continued)

(52) U.S. Cl.
CPC ............ *H03F 1/0288* (2013.01); *H03F 3/19* (2013.01); *H03F 3/602* (2013.01); *H03F 3/68* (2013.01);
(Continued)

(58) Field of Classification Search
CPC .......... H03F 1/0288; H03F 3/19; H03F 3/602; H03F 3/68; H03F 3/211; H03F 3/605; H03F 1/07
(Continued)

(56) References Cited

U.S. PATENT DOCUMENTS 5,111,157 A     5/1992  Komiak
7,557,652 B2    7/2009  Klingberg et al.
(Continued)

FOREIGN PATENT DOCUMENTS

EP    2 362 541 A1    8/2011
WO    WO 2004/023647 A1    3/2004
(Continued)

OTHER PUBLICATIONS

International Search Report for International Application No. PCT/SE2014/050566 mailed Aug. 22, 2014, 5 pages.
(Continued)

*Primary Examiner* — Khanh V Nguyen
(74) *Attorney, Agent, or Firm* — Myers Bigel, P.A.

(57) ABSTRACT

A first amplifier is coupled to an output node via a first line having first and second portions. A second amplifier is coupled to the output node via a second line having first and second portions. An auxiliary amplifier is coupled via an auxiliary line network to a first intersection between the first and second portions of the first line, and to a second intersection between the first and second portions of the second line. For each of the first and second lines, the first and second portions have a higher-impedance portion and a lower-impedance portion whose combined length is a half wavelength. Lengths of the respective first portions of the first and second lines sum to half a wavelength, and the lengths of the respective second portions of the first and second lines sum to half a wavelength.

17 Claims, 16 Drawing Sheets

(51) Int. Cl.
*H03F 3/60* (2006.01)
*H03F 3/19* (2006.01)

(52) U.S. Cl.
CPC ... *H03F 2200/423* (2013.01); *H03F 2200/451* (2013.01)

(58) Field of Classification Search
USPC .............................................. 330/124 R, 295
See application file for complete search history.

(56) References Cited

U.S. PATENT DOCUMENTS

| | | | |
|---|---|---|---|
| 8,441,321 B2 | 5/2013 | Hellberg | |
| 8,717,099 B2* | 5/2014 | Wilson | H03F 1/0288 330/295 |
| 2005/0225385 A1 | 10/2005 | Merrill | |
| 2006/0164163 A1 | 7/2006 | Apel et al. | |
| 2006/0192615 A1 | 8/2006 | Fraysse | |
| 2008/0007330 A1 | 1/2008 | Klingberg et al. | |
| 2010/0315162 A1 | 12/2010 | Gajadharsing | |
| 2011/0175677 A1 | 7/2011 | Jeong et al. | |
| 2013/0154731 A1 | 6/2013 | Gajadharsing | |
| 2014/0062601 A1* | 3/2014 | Acimovic | H03F 1/0288 330/295 |

FOREIGN PATENT DOCUMENTS

| | | |
|---|---|---|
| WO | WO 2004/057755 A1 | 7/2004 |
| WO | WO 2010/074615 A1 | 7/2010 |
| WO | WO 2013/087232 A1 | 6/2013 |
| WO | WO 2014/193275 A1 | 12/2014 |

OTHER PUBLICATIONS

Written Opinion of the International Searching Authority for International Application No. PCT/SE2014/050566 mailed Aug. 22, 2014, 3 pages.

International Search Report for International Application No. PCT/SE2014/050565 mailed Aug. 22, 2014, 5 pages.

Written Opinion of the International Searching Authority for International Application No. PCT/SE2014/050565 mailed Aug. 22, 2014, 3 pages.

Doherty: "A New High Efficiency Power Amplifier for Modulated Waves", Proceedings of the Institute of Radio Engineers, vol. 24, No. 9, Sep. 1936; p. 1163-1182.

Perreault: "A New Power Combining and Outphasing Modulation System for High-Efficiency Power Amplification", 2010 IEEE Midwest Symposium on Circuits and Systems, pp. 441-444, Aug. 2010; 4 pg.

Chireix: "High Power Outphasing Modulation", Proceedings of the Institute of Radio Engineers, vol. 23, No. 11, Nov. 1935, p. 1370-1392.

* cited by examiner

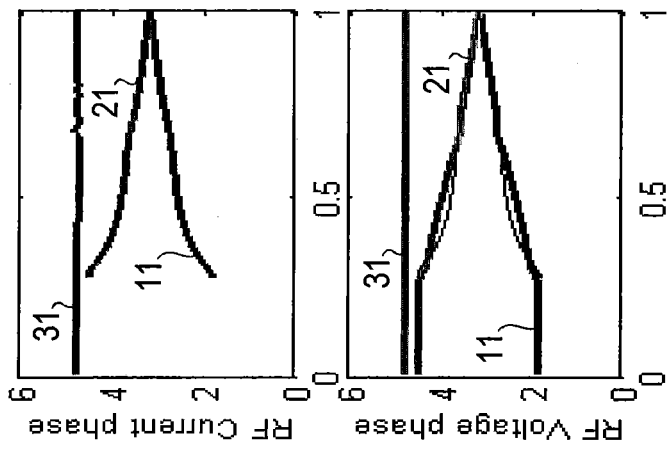
Fig. 3e
Fig. 3f
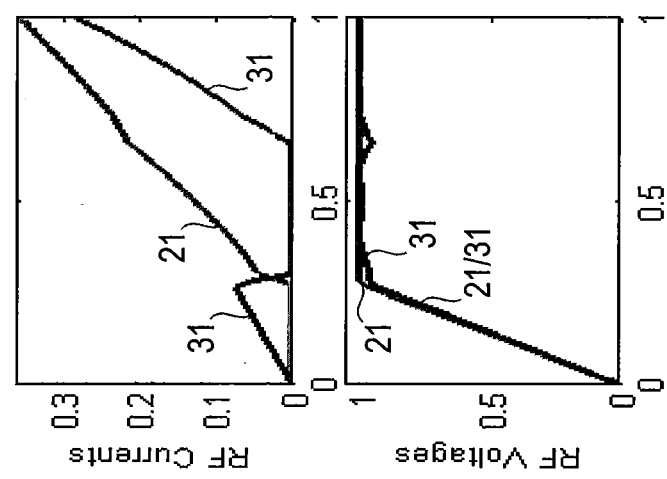
Fig. 3b
Fig. 3c
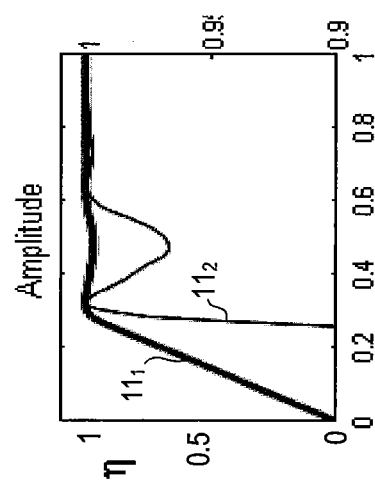
Fig. 3d

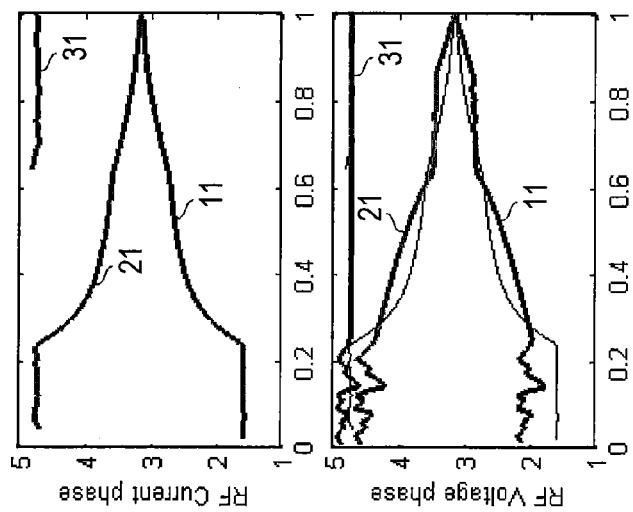
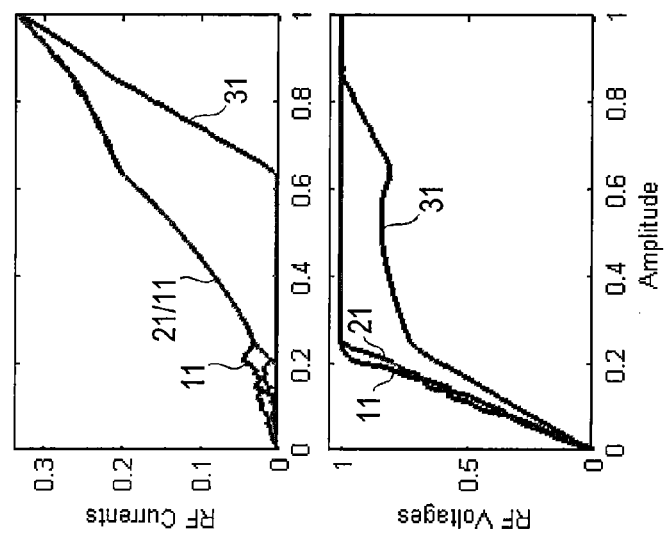
Fig. 4e
Fig. 4f
Fig. 4b
Fig. 4c
Fig. 4d

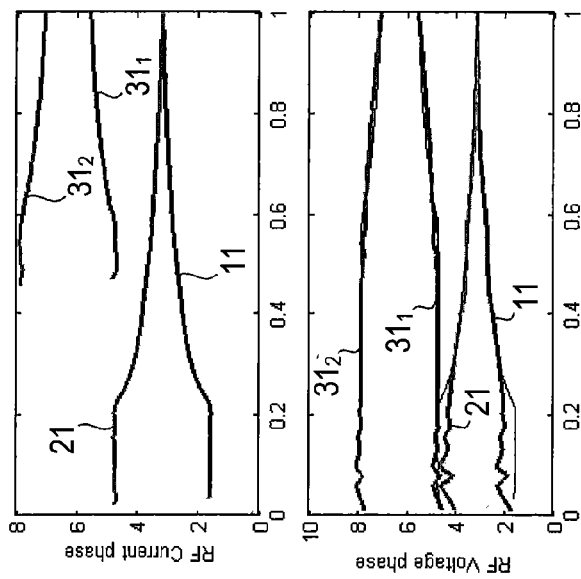
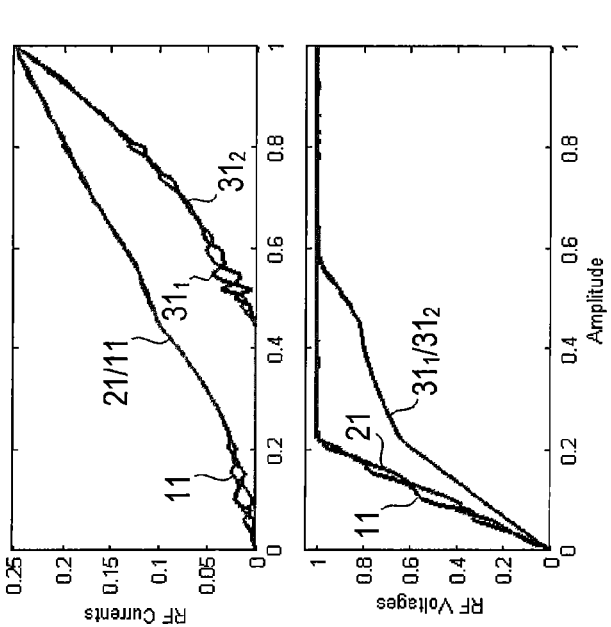
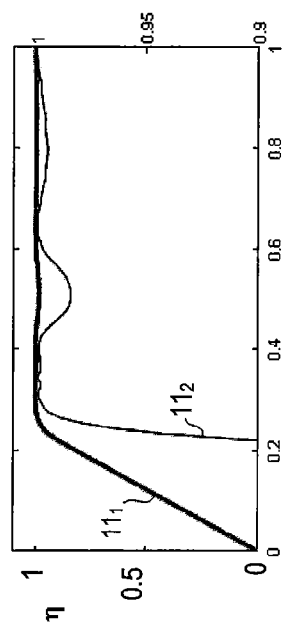

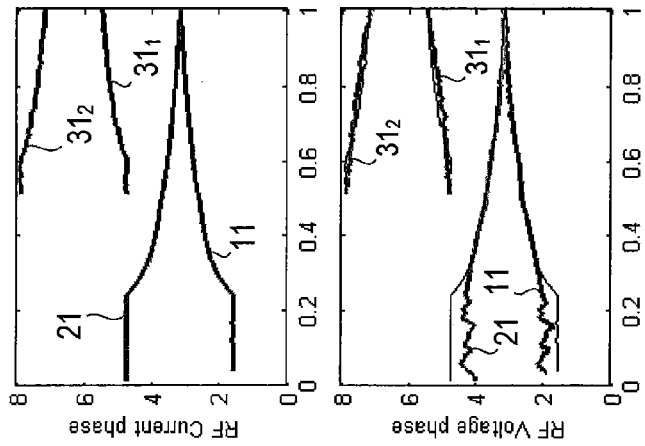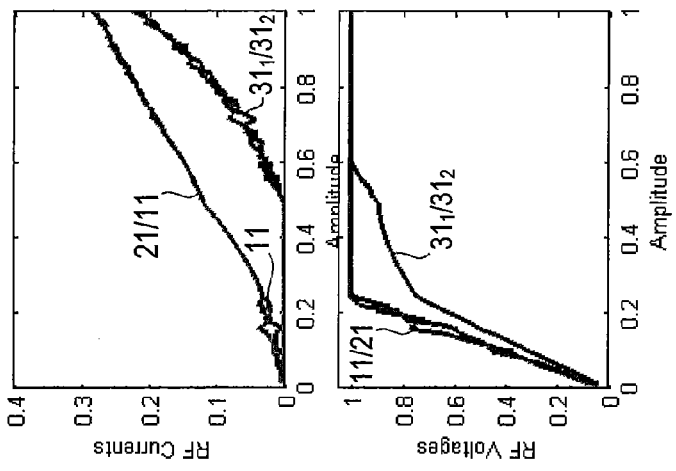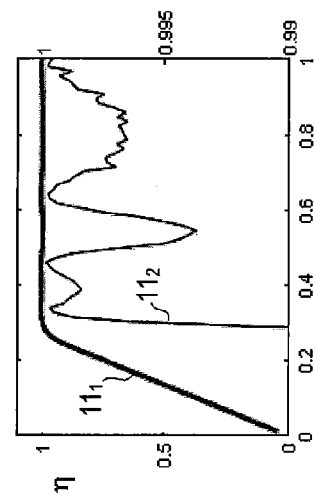
Fig. 6e
Fig. 6f
Fig. 6b
Fig. 6c
Fig. 6d

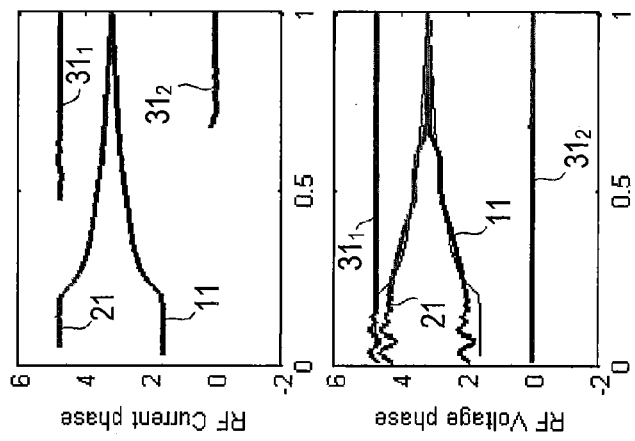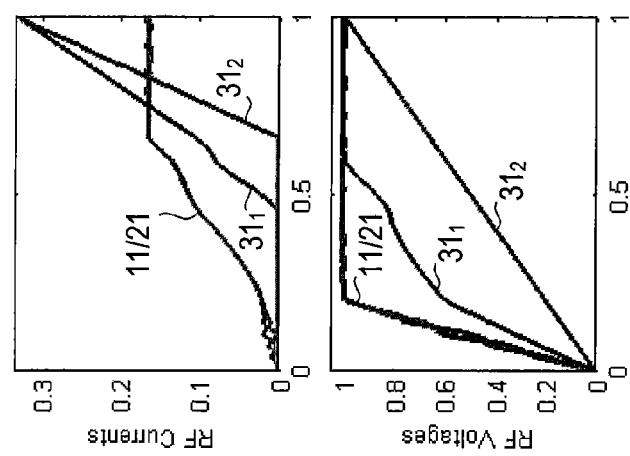

AMPLIFIER CIRCUIT AND METHOD

CROSS REFERENCE TO RELATED APPLICATION

This application is a 35 U.S.C. §371 national stage application of PCT International Application No. PCT/SE2014/050566, filed in the English language on 8 May 2014, the disclosure and content of which is incorporated by reference herein in its entirety.

TECHNICAL FIELD

The present invention relates to an amplifier circuit and method, and more particularly to an amplifier circuit and method which provides improved efficiency, for example an amplifier circuit comprising at least first and second amplifiers configured to operate in Chireix and Doherty modes of operation.

BACKGROUND

In radio base stations and other systems, power amplifiers are often used to amplify wideband signals or signal combinations with high peak to average power ratio (PAR or PAPR). The amplifiers must then be able to repeatedly output very high power for very short periods, even though the bulk of the output power is generated at the much lower average power, level. In systems with random phase combinations of many signals (without any dominating ones) the amplitude of the signal follows a Rayleigh distribution.

A conventional single-transistor power amplifier (for example a class B, AB or F power amplifier) has a fixed radio frequency (RF) load resistance and a fixed voltage supply. The bias in class B or AB amplifiers causes the output current to have a form close to that of a pulse train of half wave rectified sinusoid current pulses. The direct current (DC) current (and hence DC power) is therefore largely proportional to the RF output current amplitude (and voltage). The output power, however, is proportional to the RF output current squared. The efficiency, i.e. output power divided by DC power, is therefore also proportional to the output amplitude. The average efficiency of a power amplifier is consequently low when amplifying signals that on average have a low output amplitude (or power) compared to the maximum required output amplitude (or power), i.e. high PAR.

A Chireix amplifier (as described in "High power outphasing modulation," Proc. IRE, vol. 23, no. 11, pp. 1370-1392, November 1935, by H Chireix), or a Doherty amplifier (as described in "A new high efficiency power amplifier for modulated waves", by W. H. Doherty, Proc. IRE, vol. 24, no. 9, pp. 1163-1182, September 1936) were the first examples of amplifiers based on multiple transistors with passive output network interaction and combination.

They have high average efficiency for amplitude-modulated signals with high peak-to-average ratio (PAR) since they have a much lower average sum of RF output current magnitudes from the transistors at low amplitudes. This causes high average efficiency since the DC currents drawn by the transistors are largely proportional to the RF current magnitudes.

The RF output current from the "peaking" sub-amplifier in the Doherty amplifier needs to rise linearly from zero at a "transition point" to full current at full amplitude. The "main" sub-amplifier has an entirely linear output current. The sum of the amplitudes of these currents deviates far from the ideal parabolic shape (of a constant efficiency amplifier), so the dip in efficiency in the upper amplitude region is quite substantial. Another way to intuitively get to the same result is to observe that the RF voltage at the peaking sub-amplifier is only medium high at the transition point, so the output current pulses will here experience large voltage drop across the transistor.

The Chireix amplifier has high efficiency in the upper amplitude region, since both sub-amplifier RF voltage amplitudes are high, and close in phase with the respective RF currents. Since variations in output amplitude are accompanied by phase shifts in the sub-amplifier RF voltages this operation mode is called "outphasing". In the outphasing region, the current pulses experience low voltage drop across the transistors. The RF current increase at the transition point is very gradual, and the overall shape of the sum of RF current amplitudes is much closer to the ideal parabolic shape than for the Doherty amplifier. The drawback of having both RF voltages high is that the efficiency of the amplifier is degraded by shunt loss, i.e. loss that behaves like a resistor coupled from the transistor output to ground (RF wise). With low loss transistors, Chireix outphasing is very efficient.

Earlier patent applications WO 2004/023647 and WO 2004/057755 by the present applicant describe an expandable multi-amplifier (having 3 sub-amplifiers and higher) structures containing one or more Chireix stages. Earlier patent application WO 2010/074615, also by the present applicant, describes a family of "Quasi-Chireix" amplifiers that have very high efficiency in both 3 and 4-stage (and higher) variants.

A paper by D. J. Perreault entitled "A new power combining and outphasing modulation system for high-efficiency power amplification", IEEE Proc. MWSCAS, 2010, pp. 441-444, describes hierarchic Chireix amplifiers that have higher efficiency than the 4-stage variants of WO 2004/023647 and WO 2010/074615 when very low loss transistors (specifically, low shunt loss) are employed. However, the amplifiers in the paper by Perreault only exist for 4, 8, 16 . . . etc. (powers of two) sub-amplifiers.

Earlier patent application WO 2013/087232, also by the present applicant describes asymmetric hierarchic Chireix amplifiers that can be used when other numbers of transistors are called for, such as 3, 5, 6, 7, 9 . . . etc. The "Chireix-Doherty" 3-stage amplifier of WO 2004/057755 has been improved for transistors with high shunt loss, and very much improved for having one transistor with very high loss, in co-pending application PCT/SE2013/050605, also by the present applicant.

The first Chireix-Doherty amplifiers of WO 2004/057755 and also the improved variant of co-pending application PCT/SE2013/050605 have a Chireix pair that is outphasing with very high efficiency in a middle amplitude region. In the upper amplitude region (its proportion determined by the size of the "peaking" sub-amplifier) they behave like the upper region in a Doherty amplifier, and are therefore sub-optimal when low shunt loss transistors are employed.

The amplifiers in WO 2010/074615 increase the proportion of outphasing behavior, and exist in both 3-stage and 4-stage versions, but require different size sub-amplifiers and have slightly sub-optimal efficiency with very low-loss transistors.

The 4-stage amplifiers Perreault are very close to optimal with very low-loss transistors, but do not exist for circuits having 3 sub-amplifier stages. The optimality also breaks down substantially if different size sub-amplifier pairs are employed.

The amplifiers in WO 2013/087232 exist in 3-stage versions with equal size sub-amplifiers, but have sub-optimal efficiency in a middle amplitude region when the lowermost transition point is placed at too low an amplitude.

SUMMARY

It is an aim of the present invention to provide a method and apparatus which obviate or reduce at least one or more of the disadvantages mentioned above.

According to a first aspect of the present invention there is provided an amplifier circuit comprising a first amplifier configured to amplify a first input signal. An output of the first amplifier is coupled to an output node via a first transmission line. The first transmission line comprises a first portion having a first characteristic impedance and a first length, and a second portion having a second characteristic impedance and a second length. The amplifier circuit further comprises a second amplifier configured to amplify a second input signal. An output of the second amplifier is coupled to the output node via a second transmission line. The second transmission line comprises a first portion having a first characteristic impedance and a first length, and a second portion having a second characteristic impedance and a second length. The amplifier circuit further comprises an auxiliary amplifier configured to amplify a third input signal. An output of the auxiliary amplifier is coupled via an auxiliary transmission line network to a first intersection between the first and second portions of the first transmission line, and to a second intersection between the first and second portions of the second transmission line. For each of the first and second transmission lines, the first and second portions consist of a higher-impedance portion and a lower-impedance portion whose combined length is a half wavelength, wherein the lengths of the respective first portions of the first and second transmission lines sum to half a wavelength, and the lengths of the respective second portions of the first and second transmission lines sum to half a wavelength.

According to another aspect of the present invention there is provided a method in an amplifier circuit. The method comprises the steps of amplifying a first input signal using a first amplifier, and coupling the amplified first input signal to an output node via a first transmission line, the first transmission line comprising a first portion having a first characteristic impedance and a first length, and a second portion having a second characteristic impedance and a second length. The method further comprises the steps of amplifying a second input signal using a second amplifier, and coupling the amplified second input signal to the output node via a second transmission line, the second transmission line comprising a first portion having a first characteristic impedance and a first length, and a second portion having a second characteristic impedance and a second length. The method further comprises the steps of amplifying a third input signal using an auxiliary amplifier, and coupling the output of the auxiliary amplifier via an auxiliary transmission line network to a first intersection between the first and second portions of the first transmission line, and to a second intersection between the first and second portions of the second transmission line, wherein for each of the first and second transmission lines, the first and second portions consist of a higher-impedance portion and a lower-impedance portion whose combined length is a half wavelength, and wherein the lengths of the respective first portions of the first and second transmission lines sum to half a wavelength, and the lengths of the respective second portions of the first and second transmission lines sum to half a wavelength.

BRIEF DESCRIPTION OF THE DRAWINGS

For a better understanding of examples of the present invention, and to show more clearly how the examples may be carried into effect, reference will now be made, by way of example only, to the following drawings in which:

FIGS. 2b to 2f show associated RF currents, voltages and efficiency curves relating to the embodiment of FIG. 2a;

FIGS. 3b to 3f show associated RF currents, voltages and efficiency curves relating to the embodiment of FIG. 3a;

FIGS. 4b to 4f show associated RF currents, voltages and efficiency curves relating to the embodiment of FIG. 4a;

FIGS. 5b to 5f show associated RF currents, voltages and efficiency curves relating to the embodiment of FIG. 5a;

FIGS. 6b to 6f show associated RF currents, voltages and efficiency curves relating to the embodiment of FIG. 6a;

FIGS. 7b to 7f show associated RF currents, voltages and efficiency curves relating to the embodiment of FIG. 7a;

FIGS. 8b to 8f show associated RF currents, voltages and efficiency curves relating to the embodiment of FIG. 8a.

DETAILED DESCRIPTION

Embodiments of the present invention are aimed at providing 3-stage amplifiers with close to optimal efficiency for very low loss transistors. Other embodiments of the present invention are aimed at providing close to optimal 4-stage amplifiers with good efficiency also when different size sub-amplifier pairs are employed.

With low shunt loss in the transistors, the embodiments of the present invention aim to minimize series losses, including loss due to voltage drop across the transistor during the current pulse. Embodiments of the present invention achieve this by having small phase difference between RF currents and voltages at the respective sub-amplifiers' output nodes, and having high RF voltage swing when current is drawn. Beneficial interactions between sub-amplifiers that enable this behaviour are in the embodiments of the present invention made possible by new structures of the electrical network over which the sub-amplifiers are interacting and connected to the output.

Figure 1:
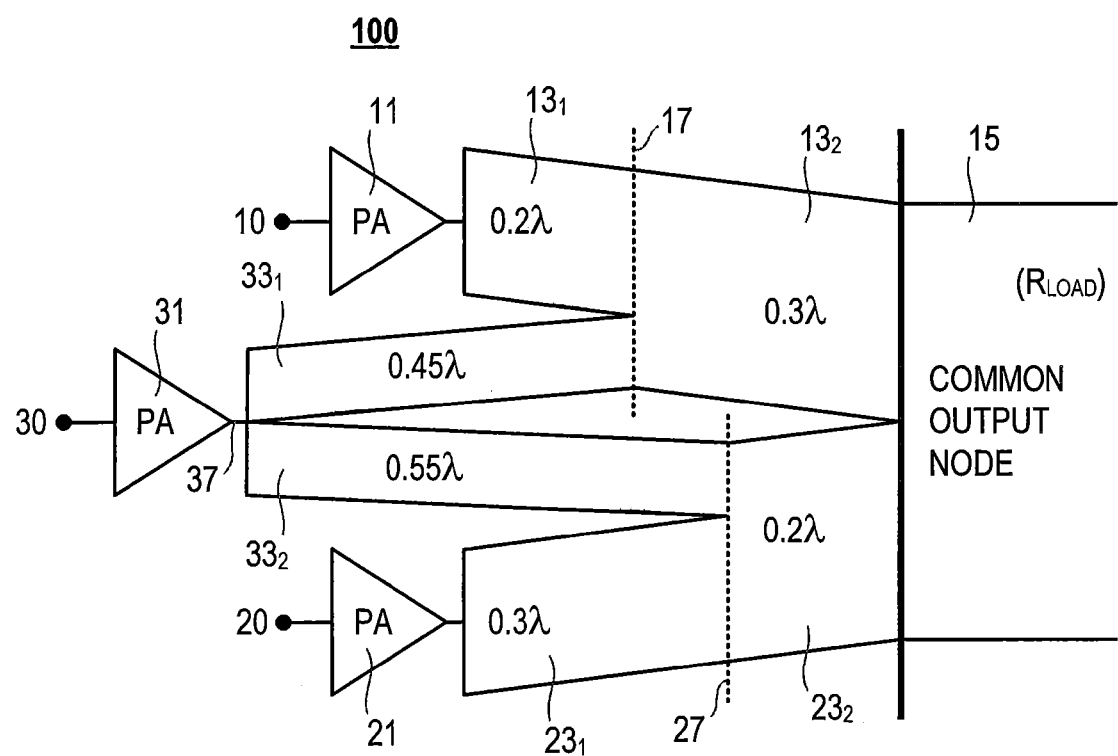
FIG. 1 shows an amplifier circuit according to a first embodiment of the present invention.

FIG. 1 shows an amplifier circuit according to an embodiment of the invention. The amplifier circuit comprises a first amplifier 11 configured to amplify a first input signal 10. An output of the first amplifier 11 is coupled to an output node 15 via a first transmission line 13. The first transmission line 13 comprises a first portion $13_1$ having a first characteristic impedance and a first length, and a second portion $13_2$ having a second characteristic impedance and a second length.

The amplifier circuit also comprises a second amplifier 21 configured to amplify a second input signal 20. An output of the second amplifier 21 is coupled to the output node 15 via a second transmission line 23. The second transmission line 23 comprises a first portion $23_1$ having a first characteristic impedance and a first length, and a second portion $23_2$ having a second characteristic impedance and a second length.

The amplifier circuit also comprises an auxiliary amplifier 31 (also referred to herein as a peaking amplifier) configured to amplify a third input signal 30. An output of the auxiliary amplifier 31 is coupled via an auxiliary transmission line network ($33_1$, $33_2$) to a first intersection 17 between the first and second portions $13_1$, $13_2$ of the first transmission line 13, and to a second intersection 27 between the first and second portions $23_1$, $23_2$ of the second transmission line 23.

For each of the first and second transmission lines 13, 23, the first and second portions consist of a higher-impedance portion and a lower-impedance portion whose combined length is a half wavelength.

For example, in the embodiment of FIG. 1, the first transmission line 13 comprises a first portion $13_1$ having an electrical length of $0.2\lambda$, and a second portion $13_2$ having an electrical length of $0.3\lambda$, such that the sum of the electrical lengths is $0.5\lambda$. The characteristic impedance of the first portion $13_1$ is higher that the characteristic impedance of the second portion $13_2$, as represented by the relative thicknesses of the transmission lines (the smaller the thickness the higher the characteristic impedance, and vice versa, which also applies to other embodiments of the invention as described herein).

Furthermore, the lengths of the respective first portions $13_1$, $23_1$ of the first and second transmission lines 13, 23 also sum to half a wavelength, while the lengths of the respective second portions $13_2$, $23_2$ of the first and second transmission lines 13, 23 also sum to half a wavelength.

For example, in the example of FIG. 1 the lengths of the respective first portions $13_1$, $23_1$ of the first and second transmission lines 13, 23, i.e. $0.2\lambda$ and of $0.3\lambda$, respectively, sum to half a wavelength, while the lengths of the respective second portions $13_2$, $23_2$ of the first and second transmission lines 13, 23 also sum to half a wavelength, i.e. the sum of $0.3\lambda$ and $0.2\lambda$.

It is also noted that in the example of FIG. 1, the length of the first portion $13_1$ of the first transmission line 13 is substantially equal to the length of the second portion $23_2$ of the second transmission line 23 and/or wherein the length of the first portion $23_1$ of the second transmission line 23 is substantially equal to the length of the second portion $13_2$ of the first transmission line 13.

From the example of FIG. 1 is can be seen that the auxiliary amplifier 31 is coupled directly (or by a half wavelength line) to a auxiliary junction 37 from which it branches (via first and second auxiliary transmission lines $33_1$ and $33_2$) to the Chireix pair midpoint junctions (i.e. the first and second intersections 17, 27). The length of each of the first and second auxiliary transmission lines $33_1$ and $33_2$ is three quarters of a wavelength minus the length of the second portion of the respective transmission lines which connects the auxiliary transmission line to the output (i.e. the section of transmission line from the midpoint to the output).

As such, the total length from the auxiliary amplifier 31 to the output 15 through any path is equal to three quarter wavelengths (assuming the auxiliary amplifier 31 is directly coupled to the auxiliary junction 37).

With appropriate dimensioning, these new amplifiers extend the Chireix outphasing operation from low amplitude the whole way to the maximum amplitude into a wide and very efficient region.

It is noted that a feature of the output network in the example of FIG. 1, and the other embodiments described herein, is the branching structure that connects a single sub-amplifier (or a Chireix pair in the 4-stage case) to points along the lines that connect two other amplifiers to the output. In this regard it is similar to the amplifier described in co-pending application PCT/SE2013/050605, but whereby the selection of different electrical length relations cause these new amplifiers to have entirely different interactions (just as the difference in interactions between Doherty and Chireix amplifiers is caused by just two differences in electrical length).

Figure 2A:
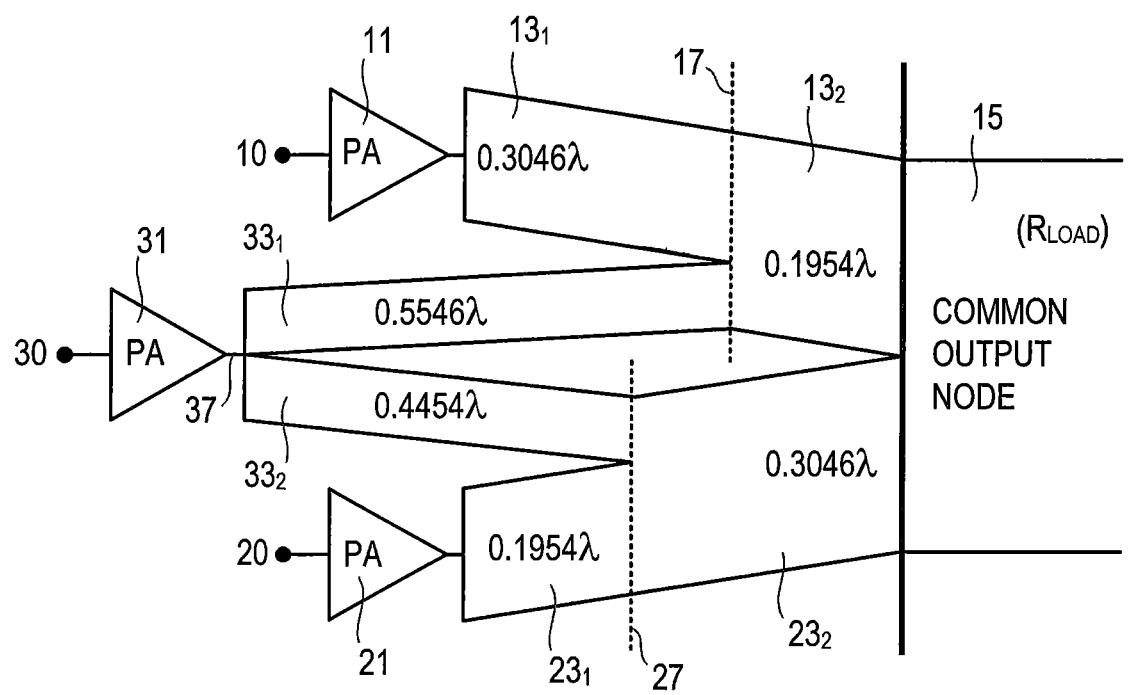
FIG. 2a shows an amplifier circuit according to another embodiment of the present invention.
Figure 2B:
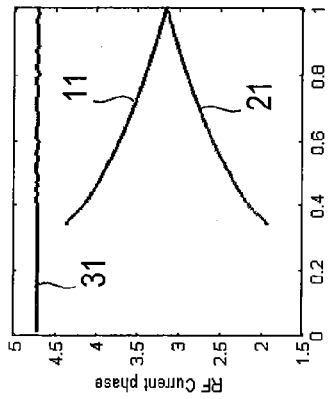
Figure 2E:
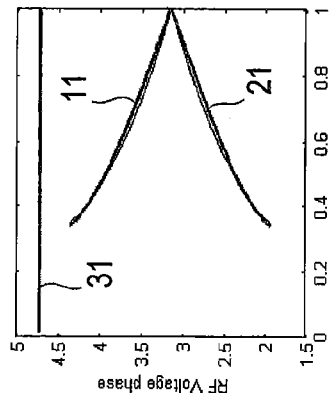
Figure 2C:
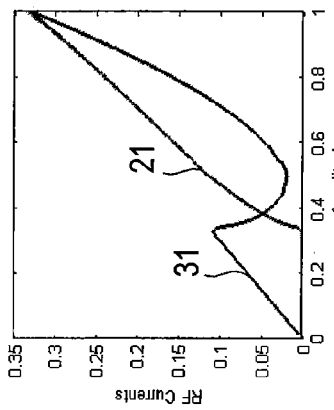
Figure 2F:
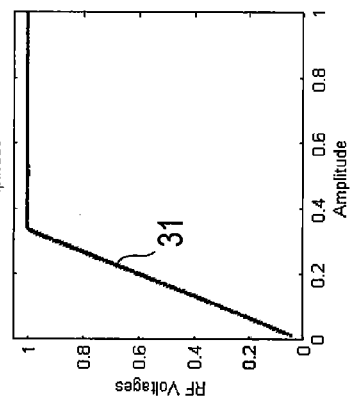
Figure 2D:
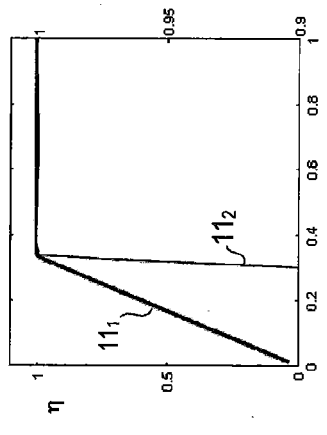

FIG. 2a shows an example of an amplifier circuit according to another embodiment of the present invention.

The amplifier circuit comprises a first amplifier 11 configured to amplify a first input signal 10. An output of the first amplifier 11 is coupled to an output node 15 via a first transmission line 13. The first transmission line 13 comprises a first portion $13_1$ having a first characteristic impedance and a first length, and a second portion $13_2$ having a second characteristic impedance and a second length.

The amplifier circuit also comprises a second amplifier 21 configured to amplify a second input signal 20. An output of the second amplifier 21 is coupled to the output node 15 via a second transmission line 23. The second transmission line 23 comprises a first portion $23_1$ having a first characteristic impedance and a first length, and a second portion $23_2$ having a second characteristic impedance and a second length.

The amplifier circuit also comprises an auxiliary amplifier 31 (also referred to herein as a peaking amplifier) configured to amplify a third input signal 30. An output of the auxiliary amplifier 31 is coupled via an auxiliary transmission line network ($33_1$, $33_2$) to a first intersection 17 between the first and second portions $13_1$, $13_2$ of the first transmission line 13, and to a second intersection 27 between the first and second portions $23_1$, $23_2$ of the second transmission line 23.

For each of the first and second transmission lines 13, 23, the first and second portions consist of a higher-impedance portion and a lower-impedance portion whose combined length is a half wavelength.

Furthermore, the lengths of the respective first portions $13_1$, $23_1$ of the first and second transmission lines 13, 23 also sum to half a wavelength, while the lengths of the respective second portions $13_2$, $23_2$ of the first and second transmission lines 13, 23 also sum to half a wavelength.

For example, in the embodiment of FIG. 2a, the first transmission line 13 comprises a first portion $13_1$ having an electrical length of $0.3046\lambda$, and a second portion $13_2$ having an electrical length of $0.1954\lambda$, such that the sum of the electrical lengths is $0.5\lambda$.

Also in the example of FIG. 2a the lengths of the respective first portions $13_1$, $23_1$ of the first and second transmission lines 13, 23, i.e. $0.3046\lambda$ for the first portion $13_1$ and $0.1954\lambda$ for the first portion $23_1$ sum to half a wavelength, while the lengths of the respective second portions $13_2$, $23_2$ of the first and second transmission lines 13, 23 also sum to half a wavelength, i.e. the sum of $0.1954\lambda$ and $0.3046\lambda$.

In the embodiment of FIG. 2a, the auxiliary transmission line network comprises first and second auxiliary transmission lines $33_1$ and $33_2$ for coupling the auxiliary amplifier 31 to the first and second intersections 17, 27, respectively, of the first and second transmission lines 13, 23. The length of each of the first and second auxiliary transmission lines $33_1$, $33_2$ is three quarters of a wavelength minus the length of the second portion $13_2$, $23_2$ of the respective transmission line which connects the auxiliary transmission line to the output.

In the example of FIG. 2a the auxiliary transmission line $33_1$ is therefore 0.5546λ (i.e. 0.75λ minus the length 0.1954λ of the second portion $13_2$ of the first transmission line 13). Likewise, the auxiliary transmission line $33_2$ is therefore 0.4454λ (i.e. 0.75λ minus the length 0.3046λ of the second portion $23_2$ of the second transmission line 23). FIGS. 2b to 2f show associated RF currents, voltages and efficiency curves relating to the embodiment of FIG. 2a. It is noted that in FIG. 2d the curve labelled $11_1$ is the efficiency curve in a scale of 0 to 1, while the curve $11_2$ is the same efficiency curve but magnified to help illustrate its characteristics.

In the example of FIG. 2a all three amplifiers (i.e. the first amplifier 11, the second amplifier 21 and the auxiliary amplifier 31) are of substantially the same size. The auxiliary amplifier 31 is the one that is active in the lowermost amplitude region. The whole upper region above about ⅓ amplitude consists of almost perfect outphasing behavior, with extremely low phase differences between sub-amplifiers currents and voltages. The RF current amplitude of the auxiliary amplifier first diminishes until at amplitude 0.5 it starts increasing again. The relative efficiency (linear model) is above 99.9% in the whole region above 0.34 of full amplitude.

Figure 3A:
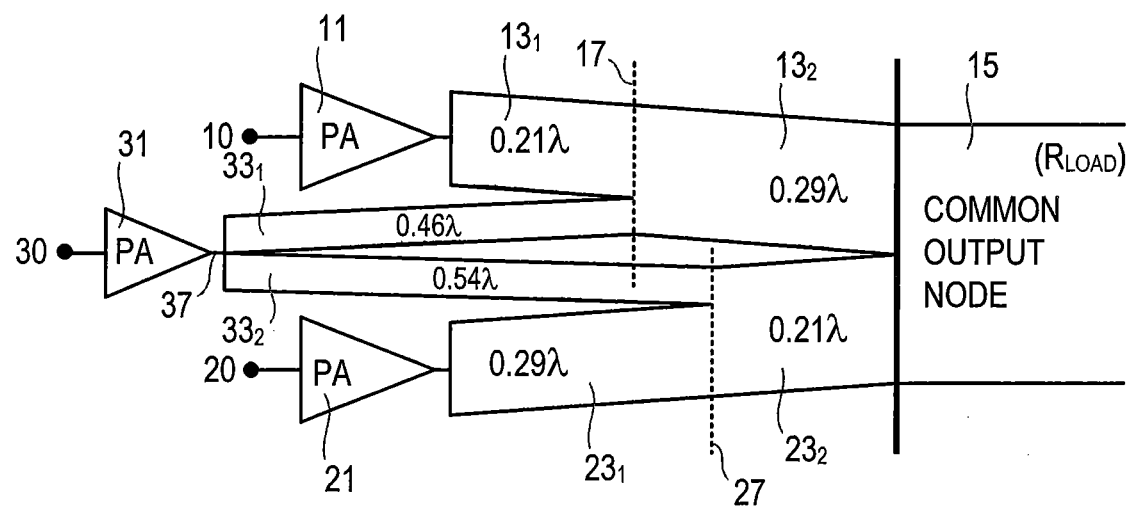
FIG. 3a shows an amplifier circuit according to another embodiment of the present invention.
Figure 4A:
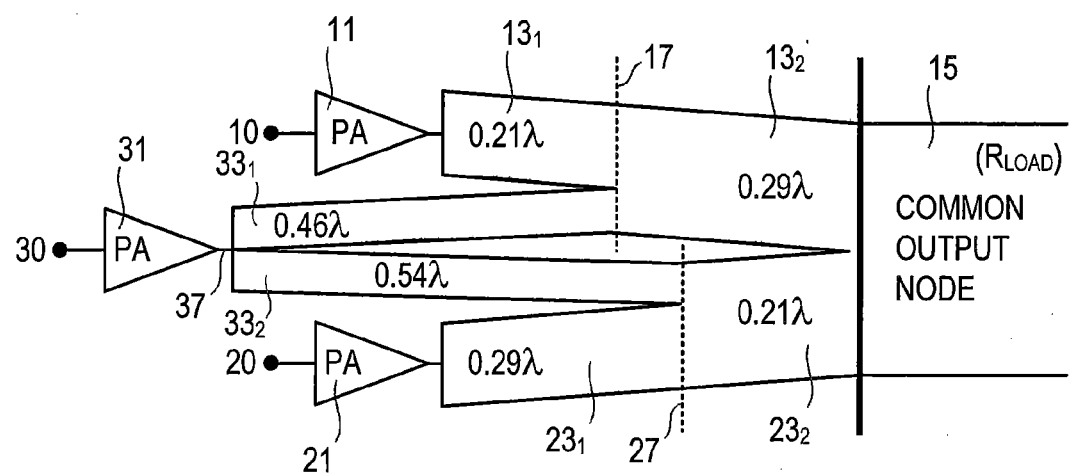
FIG. 4a shows an amplifier circuit according to another embodiment of the present invention.

It is possible to change the location of the efficiency peaks, by changing the length parameter. The efficiency in the middle amplitude range is not as optimal if the efficiency "corner" is placed at a lower amplitude. The size of the third sub-amplifier can also be changed in this process. In the embodiments of FIGS. 3a and 4a there are shown examples with the electrical length parameter is increased by about 0.01 compared to the previous example of FIG. 2a, and in the example of FIG. 3a also with the auxiliary amplifier being 80% of the size of the first and second amplifiers. It is noted that the lengths in the two branches have been "mirrored" between FIGS. 2a and 3a, such that the "same" part (for example 0.195λ of the first portion $23_1$ of the second transmission line 23 of FIG. 2a) has been increased to 0.21λ in the first portion $13_1$ of the first transmission line 13 of FIG. 3a. It is also noted that these values are examples only, and that other values may be used without departing from the scope of the invention as defined in the appended claims.

FIG. 3a shows an example of an amplifier circuit according to another embodiment of the present invention.

The amplifier circuit comprises a first amplifier 11 configured to amplify a first input signal 10. An output of the first amplifier 11 is coupled to an output node 15 via a first transmission line 13. The first transmission line 13 comprises a first portion $13_1$ having a first characteristic impedance and a first length, and a second portion $13_2$ having a second characteristic impedance and a second length.

The amplifier circuit also comprises a second amplifier 21 configured to amplify a second input signal 20. An output of the second amplifier 21 is coupled to the output node 15 via a second transmission line 23. The second transmission line 23 comprises a first portion $23_1$ having a first characteristic impedance and a first length, and a second portion $23_2$ having a second characteristic impedance and a second length.

The amplifier circuit also comprises an auxiliary amplifier 31 (also referred to herein as a peaking amplifier) configured to amplify a third input signal 30. An output of the auxiliary amplifier 31 is coupled via an auxiliary transmission line network ($33_1$, $33_2$) to a first intersection 17 between the first and second portions $13_1$, $13_2$ of the first transmission line 13, and to a second intersection 27 between the first and second portions $23_1$, $23_2$ of the second transmission line 23.

For each of the first and second transmission lines 13, 23, the first and second portions consist of a higher-impedance portion and a lower-impedance portion whose combined length is a half wavelength.

Furthermore, the lengths of the respective first portions $13_1$, $23_1$ of the first and second transmission lines 13, 23 also sum to half a wavelength, while the lengths of the respective second portions $13_2$, $23_2$ of the first and second transmission lines 13, 23 also sum to half a wavelength.

In the example of FIG. 3a the first amplifier 11 and the second amplifier 21 are of substantially the same size, and the auxiliary amplifier 31 reduced in size compared to the first and second amplifiers, for example 80% of the size of the others.

For example, in the embodiment of FIG. 3a, the first transmission line 13 comprises a first portion $13_1$ having an electrical length of 0.21λ, and a second portion $13_2$ having an electrical length of 0.29λ, such that the sum of the electrical lengths is 0.5λ.

Also in the example of FIG. 3a the lengths of the respective first portions $13_1$, $23_1$ of the first and second transmission lines 13, 23, i.e. 0.21λ for the first portion $13_1$ and 0.29λ for the first portion $23_1$ sum to half a wavelength, while the lengths of the respective second portions $13_2$, $23_2$ of the first and second transmission lines 13, 23 also sum to half a wavelength, i.e. the sum of 0.29λ and 0.21λ.

In the embodiment of FIG. 3a, the auxiliary transmission line network comprises first and second auxiliary transmission lines $33_1$ and $33_2$ for coupling the auxiliary amplifier 31 to the first and second intersections of the first and second transmission lines 13, 23. The length of each of the first and second auxiliary transmission lines $33_1$, $33_2$ is three quarters of a wavelength minus the length of the second portion $13_2$, $23_2$ of the respective transmission line which connects the auxiliary transmission line to the output.

In the example of FIG. 3a the auxiliary transmission line $33_1$ is therefore 0.46λ (i.e. 0.75λ minus the length 0.29λ of the second portion $13_2$ of the first transmission line 13). Likewise, the auxiliary transmission line $33_2$ is therefore 0.54λ (i.e. 0.75λ minus the length 0.21λ of the second portion $23_2$ of the second transmission line 23).

FIGS. 3b to 3f show associated RF currents, voltages and efficiency curves relating to the embodiment of FIG. 3a. It is noted that in FIG. 3d the curve labelled $11_1$ is the efficiency curve in a scale of 0 to 1, while the curve $11_2$ is the same efficiency curve but magnified to help illustrate its characteristics.

FIG. 4a shows an example of an amplifier according to another embodiment of the present invention.

The amplifier circuit comprises a first amplifier 11 configured to amplify a first input signal 10. An output of the first amplifier 11 is coupled to an output node 15 via a first transmission line 13. The first transmission line 13 comprises a first portion $13_1$ having a first characteristic impedance and a first length, and a second portion $13_2$ having a second characteristic impedance and a second length.

The amplifier circuit also comprises a second amplifier 21 configured to amplify a second input signal 20. An output of the second amplifier 21 is coupled to the output node 15 via a second transmission line 23. The second transmission line 23 comprises a first portion $23_1$ having a first characteristic impedance and a first length, and a second portion $23_2$ having a second characteristic impedance and a second length.

The amplifier circuit also comprises an auxiliary amplifier 31 (also referred to herein as a peaking amplifier) configured to amplify a third input signal 30. An output of the auxiliary amplifier 31 is coupled via an auxiliary transmission line network ($33_1$, $33_2$) to a first intersection 17 between the first and second portions $13_1$, $13_2$ of the first transmission line 13, and to a second intersection 27 between the first and second portions $23_1$, $23_2$ of the second transmission line 23.

For each of the first and second transmission lines 13, 23, the first and second portions consist of a higher-impedance portion and a lower-impedance portion whose combined length is a half wavelength.

Furthermore, the lengths of the respective first portions $13_1$, $23_1$ of the first and second transmission lines 13, 23 also sum to half a wavelength, while the lengths of the respective second portions $13_2$, $23_2$ of the first and second transmission lines 13, 23 also sum to half a wavelength.

In the example of FIG. 4a the first amplifier 11, the second amplifier 21 and the auxiliary amplifier 31 are of substantially the same size.

In the example of FIG. 4a, the first transmission line 13 comprises a first portion $13_1$ having an electrical length of 0.21λ, and a second portion $13_2$ having an electrical length of 0.29λ, such that the sum of the electrical lengths is 0.5λ.

Also in the example of FIG. 4a the lengths of the respective first portions $13_1$, $23_1$ of the first and second transmission lines 13, 23, i.e. 0.21λ for the first portion $13_1$ and 0.29λ for the first portion $23_1$ sum to half a wavelength, while the lengths of the respective second portions $13_2$, $23_2$ of the first and second transmission lines 13, 23 also sum to half a wavelength, i.e. the sum of 0.29λ and 0.21λ.

FIGS. 4b to 4f show associated RF currents, voltages and efficiency curves relating to the embodiment of FIG. 4a. It is noted that in FIG. 4d the curve labelled $11_1$ is the efficiency curve in a scale of 0 to 1, while the curve $11_2$ is the same efficiency curve but magnified to help illustrate its characteristics.

In the embodiment of FIG. 4a, the auxiliary transmission line network comprises first and second auxiliary transmission lines $33_1$ and $33_2$ for coupling the auxiliary amplifier 31 to the first and second intersections of the first and second transmission lines 13, 23. The length of each of the first and second auxiliary transmission lines $33_1$, $33_2$ is three quarters of a wavelength minus the length of the second portion $13_2$, $23_2$ of the respective transmission line which connects the auxiliary transmission line to the output.

In the example of FIG. 4a the auxiliary transmission line $33_1$ is therefore 0.46λ (i.e. 0.75λ minus the length 0.29λ of the second portion $13_2$ of the first transmission line 13). Likewise, the auxiliary transmission line $33_2$ is therefore 0.54λ (i.e. 0.75λ minus the length 0.21λ of the second portion $23_2$ of the second transmission line 23).

Figure 5A:
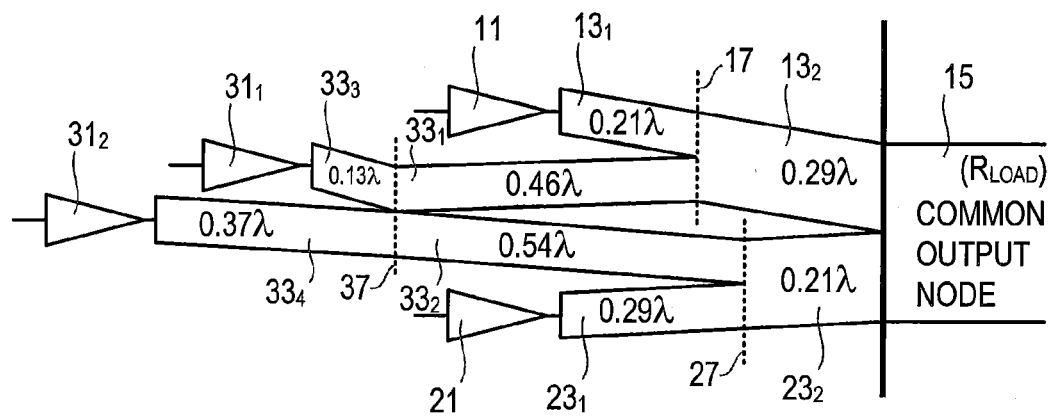
FIG. 5a shows an amplifier circuit according to another embodiment of the present invention.

In the embodiment of FIG. 5a, the auxiliary amplifier 31 is replaced with a Chireix pair $31_1$, $31_2$ to form an efficient 4-stage amplifier.

Thus, in the example of FIG. 5a, the auxiliary amplifier 31 comprises first and second auxiliary amplifiers $31_1$, $31_2$, and wherein the first auxiliary amplifier $31_1$ is coupled via a third auxiliary transmission line $33_3$ to an auxiliary junction 37, and the second auxiliary amplifier $31_2$ coupled via a fourth auxiliary transmission line $33_4$ to the auxiliary junction 37. The length of the third auxiliary transmission line $33_3$ and fourth auxiliary transmission line $33_4$ sum to half a wavelength. For example, in the embodiment of FIG. 5a the length of the third auxiliary transmission line $33_3$ is 0.13λ and the length of the fourth auxiliary transmission line $33_4$ is 0.37λ, thereby summing to 0.5λ.

As with earlier embodiments of the 3-stage configuration, the auxiliary transmission line network also comprises first and second auxiliary transmission lines $33_1$ and $33_2$ for coupling the first and second auxiliary amplifier $31_1$, $31_2$ to the first and second intersections of the first and second transmission lines 13, 23. The length of each of the first and second auxiliary transmission lines $33_1$, $33_2$ is three quarters of a wavelength minus the length of the second portion $13_2$, $23_2$ of the respective transmission line which connects the auxiliary transmission line to the output.

In the example of FIG. 5a the first auxiliary transmission line $33_1$ is therefore 0.46λ (i.e. 0.75λ minus the length 0.29λ of the second portion $13_2$ of the first transmission line 13). Likewise, the second auxiliary transmission line $33_2$ is therefore 0.54λ (i.e. 0.75λ minus the length 0.21λ of the second portion $23_2$ of the second transmission line 23).

In the example of FIG. 5a first amplifier 11, second amplifier 21, first auxiliary amplifier $31_1$ and second auxiliary amplifier $31_2$ are of substantially the same size.

The Chireix pair $31_1$, $31_2$ make it possible to extend the region of high efficiency to lower amplitudes, increasing the efficiency for high PAR signals.

As with the earlier embodiment of FIG. 4a, in the example of FIG. 5a the amplifier circuit comprises a first amplifier 11 configured to amplify a first input signal 10. An output of the first amplifier 11 is coupled to an output node 15 via a first transmission line 13. The first transmission line 13 comprises a first portion $13_1$ having a first characteristic impedance and a first length, and a second portion $13_2$ having a second characteristic impedance and a second length.

The amplifier circuit also comprises a second amplifier 21 configured to amplify a second input signal 20. An output of the second amplifier 21 is coupled to the output node 15 via a second transmission line 23. The second transmission line 23 comprises a first portion $23_1$ having a first characteristic impedance and a first length, and a second portion $23_2$ having a second characteristic impedance and a second length.

For each of the first and second transmission lines 13, 23, the first and second portions consist of a higher-impedance portion and a lower-impedance portion whose combined length is a half wavelength.

Furthermore, the lengths of the respective first portions $13_1$, $23_1$ of the first and second transmission lines 13, 23 also sum to half a wavelength, while the lengths of the respective second portions $13_2$, $23_2$ of the first and second transmission lines 13, 23 also sum to half a wavelength.

In the example of FIG. 5a, the first transmission line 13 comprises a first portion $13_1$ having an electrical length of 0.21λ, and a second portion $13_2$ having an electrical length of 0.29λ, such that the sum of the electrical lengths is 0.5λ.

Also in the example of FIG. 5a the lengths of the respective first portions $13_1$, $23_1$ of the first and second transmission lines 13, 23, i.e. 0.21λ for the first portion $13_1$ and 0.29λ for the first portion $23_1$ sum to half a wavelength, while the lengths of the respective second portions $13_2$, $23_2$ of the first and second transmission lines 13, 23 also sum to half a wavelength, i.e. the sum of 0.29λ and 0.21λ.

In the example of FIG. 5a, the characteristics of a version of this type of amplifier can be seen when using four equal size sub-amplifiers.

FIGS. 5b to 5f show associated RF currents, voltages and efficiency curves relating to the embodiment of FIG. 5a. It is noted that in FIG. 5d the curve labelled $11_1$ is the efficiency curve in a scale of 0 to 1, while the curve $11_2$ is the same efficiency curve but magnified to help illustrate its characteristics.

Figure 6A:
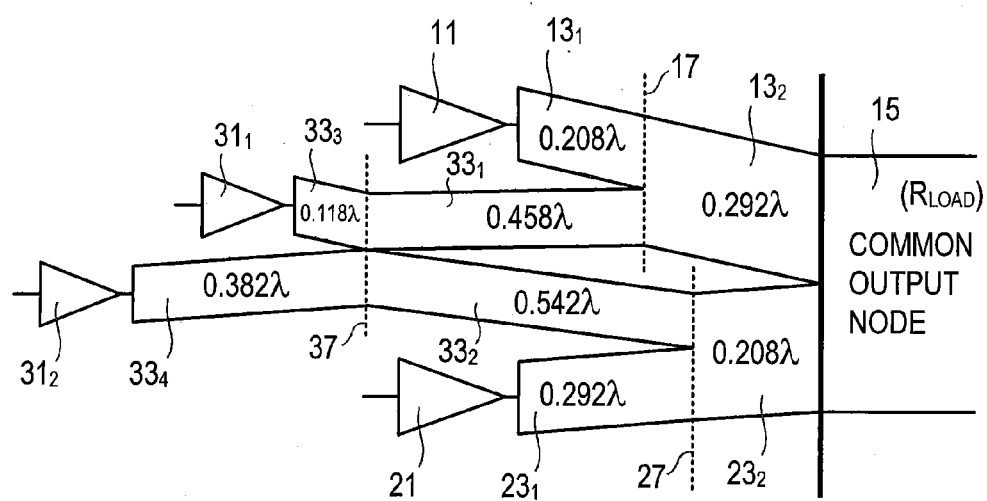
FIG. 6a shows an amplifier circuit according to another embodiment of the present invention.

Referring to the embodiment of FIG. 6a, it is also possible to have an amplifier structure which uses different size Chireix pairs, i.e. wherein the first and second auxiliary amplifiers $31_1$, $31_2$ are different in size to the first and second amplifiers 11, 21.

In the example of FIG. 6a the first amplifier 11 and second amplifier 21 are of substantially the same size, and wherein the first auxiliary amplifier $31_1$ and second auxiliary amplifier $31_2$ are of substantially the same size but smaller than the first and second amplifiers 11, 21. For example, the first auxiliary amplifier $31_1$ and second auxiliary amplifier $31_2$ are about 80% of the size of the first and second amplifiers 11, 21. It is noted that other ratios may also be used.

In the example of FIG. 6a the amplifier circuit comprises a first amplifier 11 configured to amplify a first input signal 10. An output of the first amplifier 11 is coupled to an output node 15 via a first transmission line 13. The first transmission line 13 comprises a first portion $13_1$ having a first characteristic impedance and a first length, and a second portion $13_2$ having a second characteristic impedance and a second length.

The amplifier circuit also comprises a second amplifier 21 configured to amplify a second input signal 20. An output of the second amplifier 21 is coupled to the output node 15 via a second transmission line 23. The second transmission line 23 comprises a first portion $23_1$ having a first characteristic impedance and a first length, and a second portion $23_2$ having a second characteristic impedance and a second length.

For each of the first and second transmission lines 13, 23, the first and second portions consist of a higher-impedance portion and a lower-impedance portion whose combined length is a half wavelength.

Furthermore, the lengths of the respective first portions $13_1$, $23_1$ of the first and second transmission lines 13, 23 also sum to half a wavelength, while the lengths of the respective second portions $13_2$, $23_2$ of the first and second transmission lines 13, 23 also sum to half a wavelength.

In the example of FIG. 6a, the first transmission line 13 comprises a first portion $13_1$ having an electrical length of $0.208\lambda$, and a second portion $13_2$ having an electrical length of $0.292\lambda$, such that the sum of the electrical lengths is $0.5\lambda$.

Also in the example of FIG. 6a the lengths of the respective first portions $13_1$, $23_1$ of the first and second transmission lines 13, 23, i.e. $0.208\lambda$ for the first portion $13_1$ and $0.292\lambda$ for the first portion $23_1$ sum to half a wavelength, while the lengths of the respective second portions $13_2$, $23_2$ of the first and second transmission lines 13, 23 also sum to half a wavelength, i.e. the sum of $0.292\lambda$ and $0.208\lambda$.

The auxiliary transmission line network also comprises first and second auxiliary transmission lines $33_1$ and $33_2$ for coupling the first and second auxiliary amplifiers $31_1$, $31_2$ to the first and second intersections 17, 27 of the first and second transmission lines 13, 23. The length of each of the first and second auxiliary transmission lines $33_1$, $33_2$ is three quarters of a wavelength minus the length of the second portion $13_2$, $23_2$ of the respective transmission line which connects the auxiliary transmission line to the output.

In the example of FIG. 6a the auxiliary transmission line $33_1$ is therefore $0.458\lambda$ (i.e. $0.75\lambda$ minus the length $0.292\lambda$ of the second portion $13_2$ of the first transmission line 13).

Likewise, the auxiliary transmission line $33_2$ is therefore $0.542\lambda$ (i.e. $0.75\lambda$ minus the length $0.208\lambda$ of the second portion $23_2$ of the second transmission line 23).

In the example of FIG. 6a, as with FIG. 5a the auxiliary amplifier 31 comprises first and second auxiliary amplifiers $31_1$, $31_2$, and wherein the first auxiliary amplifier $31_1$ is coupled via a third auxiliary transmission line $33_3$ to an auxiliary junction 37, and the second auxiliary amplifier $31_2$ coupled via a fourth auxiliary transmission line $33_4$ to the auxiliary junction 37. In the example the length of the third auxiliary transmission line $33_3$ and fourth auxiliary transmission line $33_4$ sum to half a wavelength, whereby the length of the third auxiliary transmission line $33_3$ is $0.118\lambda$ and the length of the fourth auxiliary transmission line $33_4$ is $0.382\lambda$, thereby summing to $0.5\lambda$.

Thus, in these examples of FIGS. 5a and 6a, the length from the auxiliary junction 37 to the output node 15 is a "constant", for example $0.75\lambda$ in these embodiments, while the sum of lengths from the Chireix pair amplifiers $31_1$ and $31_2$ to the auxiliary junction 37 is $0.5\lambda$.

Using different sized pairs as shown in the example of FIG. 6a can sometimes yield higher efficiency for a specific signal amplitude distribution.

FIGS. 6b to 6f show associated RF currents, voltages and efficiency curves relating to the embodiment of FIG. 6a. It is noted that in FIG. 6d the curve labelled $11_1$ is the efficiency curve in a scale of 0 to 1, while the curve $11_2$ is the same efficiency curve but magnified to help illustrate its characteristics.

Figure 7A:
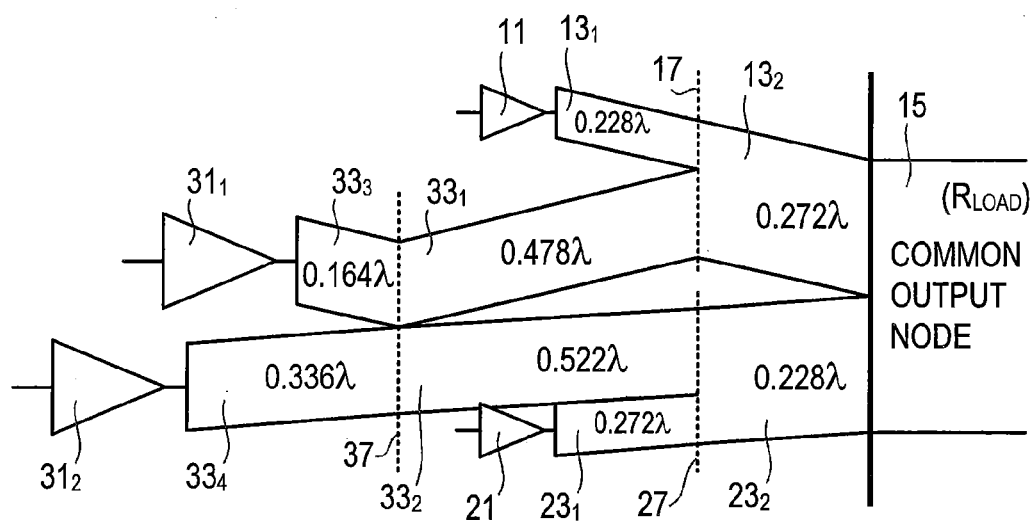
FIG. 7a shows an amplifier circuit according to another embodiment of the present invention.
Figure 7B:
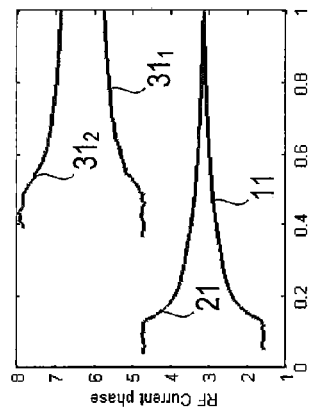
Figure 7C:
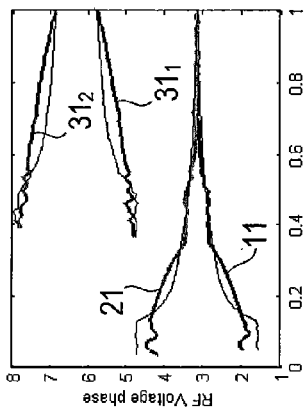
Figure 7E:
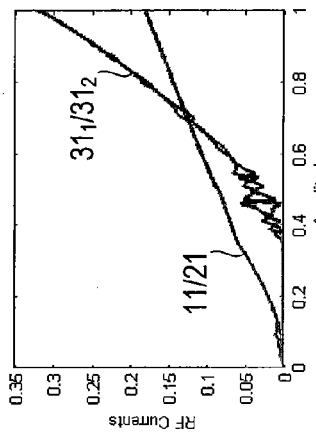
Figure 7F:
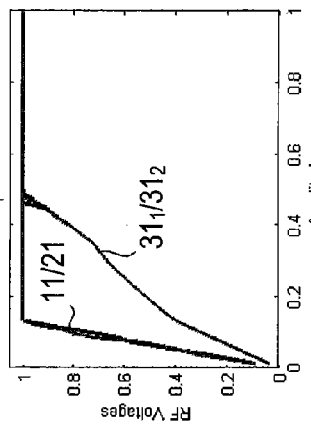
Figure 7D:
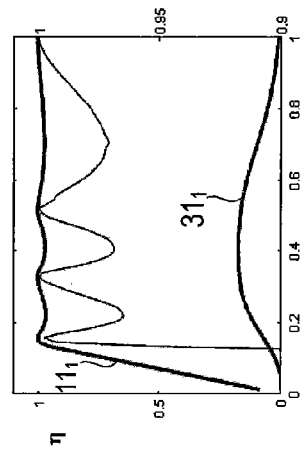

The reverse size relation between the Chireix pairs (i.e. between the first and second auxiliary amplifiers $31_1/31_2$ and the other first and second amplifiers 11/21) is also possible. Different sized pairs are also useful when the available transistor sizes do not provide the correct peak power with 4-equal dimensioning. An example of a reverse configuration with an amplifier with 2-to-1 sub-amplifier size relations is shown in FIG. 7a. The amplifier circuit according to this example has been dimensioned for larger possible PAR values.

Referring to FIG. 7a, the amplifier circuit comprises a first amplifier 11 configured to amplify a first input signal 10. An output of the first amplifier 11 is coupled to an output node 15 via a first transmission line 13. The first transmission line 13 comprises a first portion $13_1$ having a first characteristic impedance and a first length, and a second portion $13_2$ having a second characteristic impedance and a second length.

The amplifier circuit also comprises a second amplifier 21 configured to amplify a second input signal 20. An output of the second amplifier 21 is coupled to the output node 15 via a second transmission line 23. The second transmission line 23 comprises a first portion $23_1$ having a first characteristic impedance and a first length, and a second portion $23_2$ having a second characteristic impedance and a second length.

For each of the first and second transmission lines 13, 23, the first and second portions consist of a higher-impedance portion and a lower-impedance portion whose combined length is a half wavelength.

Furthermore, the lengths of the respective first portions $13_1$, $23_1$ of the first and second transmission lines 13, 23 also sum to half a wavelength, while the lengths of the respective second portions $13_2$, $23_2$ of the first and second transmission lines 13, 23 also sum to half a wavelength.

In the example of FIG. 7a, the first transmission line 13 comprises a first portion $13_1$ having an electrical length of 0.228λ, and a second portion $13_2$ having an electrical length of 0.272λ, such that the sum of the electrical lengths is 0.5λ.

Also in the example of FIG. 7a the lengths of the respective first portions $13_1$, $23_1$ of the first and second transmission lines 13, 23, i.e. 0.228λ for the first portion $13_1$ and 0.272λ for the first portion $23_1$ sum to half a wavelength, while the lengths of the respective second portions $13_2$, $23_2$ of the first and second transmission lines 13, 23 also sum to half a wavelength, i.e. the sum of 0.272λ and 0.228λ.

The auxiliary transmission line network also comprises first and second auxiliary transmission lines $33_1$ and $33_2$ for coupling the first and second auxiliary amplifiers $31_1$, $31_2$ to the first and second intersections 17, 27 of the first and second transmission lines 13, 23. The length of each of the first and second auxiliary transmission lines $33_1$, $33_2$ is three quarters of a wavelength minus the length of the second portion $13_2$, $23_2$ of the respective transmission line which connects the auxiliary transmission line to the output.

In the example of FIG. 7a the auxiliary transmission line $33_1$ is therefore 0.478λ (i.e. 0.75λ minus the length 0.272λ of the second portion $13_2$ of the first transmission line 13). Likewise, the auxiliary transmission line $33_2$ is therefore 0.522λ (i.e. 0.75λ minus the length 0.228λ of the second portion $23_2$ of the second transmission line 23).

In the example of FIG. 7a, as with FIGS. 5a and 6a the auxiliary amplifier 31 comprises first and second auxiliary amplifiers $31_1$, $31_2$, and wherein the first auxiliary amplifier $31_1$ is coupled via a third auxiliary transmission line $33_3$ to an auxiliary junction 37, and the second auxiliary amplifier $31_2$ coupled via a fourth auxiliary transmission line $33_4$ to the auxiliary junction 37. In the example of FIG. 7a the length of the third auxiliary transmission line $33_3$ is 0.164λ and the length of the fourth auxiliary transmission line $33_4$ is 0.336λ. The length of the third auxiliary transmission line $33_3$ and fourth auxiliary transmission line $33_4$ sum to half a wavelength.

Thus, according to the embodiment of FIG. 7a the first amplifier 11 and second amplifier 21 are of substantially the same size, and wherein the first auxiliary amplifier $31_1$ and second auxiliary amplifier $31_2$ are of substantially the same size but larger than the first and second amplifiers 11, 21. For example, the first amplifier 11 and second auxiliary amplifier 21 can be about 50% of the size of the first and second auxiliary amplifiers $31_1$, $31_2$.

It is noted that substituting a Chireix pair (i.e. first and second auxiliary amplifiers $31_1$ and $31_2$) for the single auxiliary amplifier 31 is not the only possibility way to extend the amplifiers of the embodiments of the present invention to higher orders.

Figure 8A:
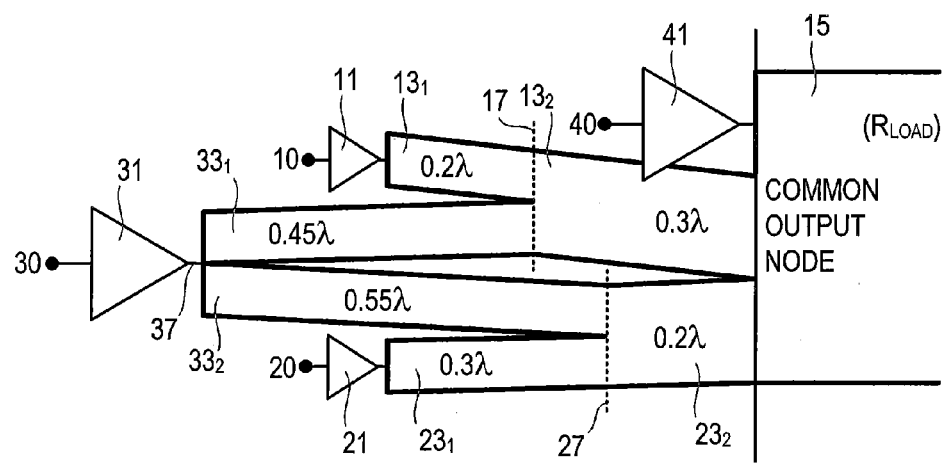
FIG. 8a shows an amplifier circuit according to another embodiment of the present invention.

FIG. 8a shows an example according to another embodiment, whereby a fourth amplifier 41 is connected directly (or connected by a half wavelength line) to the output 15, in an amplifier circuit similar to that of FIG. 1.

In FIG. 8a the amplifier circuit comprises a first amplifier 11 configured to amplify a first input signal 10. An output of the first amplifier 11 is coupled to an output node 15 via a first transmission line 13. The first transmission line 13 comprises a first portion $13_1$ having a first characteristic impedance and a first length, and a second portion $13_2$ having a second characteristic impedance and a second length.

The amplifier circuit also comprises a second amplifier 21 configured to amplify a second input signal 20. An output of the second amplifier 21 is coupled to the output node 15 via a second transmission line 23. The second transmission line 23 comprises a first portion $23_1$ having a first characteristic impedance and a first length, and a second portion $23_2$ having a second characteristic impedance and a second length.

The amplifier circuit also comprises an auxiliary amplifier 31 (also referred to herein as a peaking amplifier) configured to amplify a third input signal 30. An output of the auxiliary amplifier 31 is coupled via an auxiliary transmission line network ($33_1$, $33_2$) to a first intersection 17 between the first and second portions $13_1$, $13_2$ of the first transmission line 13, and to a second intersection 27 between the first and second portions $23_1$, $23_2$ of the second transmission line 23.

The amplifier circuit also comprises a fourth amplifier 41 coupled directly (or connected by a half wavelength line) to the output 15.

For each of the first and second transmission lines 13, 23, the first and second portions consist of a higher-impedance portion and a lower-impedance portion whose combined length is a half wavelength.

Furthermore, the lengths of the respective first portions $13_1$, $23_1$ of the first and second transmission lines 13, 23 also sum to half a wavelength, while the lengths of the respective second portions $13_2$, $23_2$ of the first and second transmission lines 13, 23 also sum to half a wavelength.

For example, in the example of FIG. 8a, the first transmission line 13 comprises a first portion $13_1$ having an electrical length of 0.2λ, and a second portion $13_2$ having an electrical length of 0.3λ, such that the sum of the electrical lengths is 0.5λ.

Also in the example of FIG. 8a the lengths of the respective first portions $13_1$, $23_1$ of the first and second transmission lines 13, 23, i.e. 0.2λ for the first portion $13_1$ and 0.3λ for the first portion $23_1$ sum to half a wavelength, while the lengths of the respective second portions $13_2$, $23_2$ of the first and second transmission lines 13, 23 also sum to half a wavelength, i.e. the sum of 0.3λ and 0.2λ.

In the embodiment of FIG. 8a, the auxiliary transmission line network comprises first and second auxiliary transmission lines $33_1$ and $33_2$ for coupling the auxiliary amplifier 31 to the first and second intersections 17, 27 of the first and second transmission lines 13, 23. The length of each of the first and second auxiliary transmission lines $33_1$, $33_2$ is three quarters of a wavelength minus the length of the second portion $13_2$, $23_2$ of the respective transmission line which connects the auxiliary transmission line to the output.

In the example of FIG. 8a the auxiliary transmission line $33_1$ is therefore 0.45λ (i.e. 0.75λ minus the length 0.3λ of the second portion $13_2$ of the first transmission line 13). Likewise, the auxiliary transmission line $33_2$ is therefore 0.55λ (i.e. 0.75λ minus the length 0.2λ of the second portion $23_2$ of the second transmission line 23).

FIGS. 8b to 8f show associated RF currents, voltages and efficiency curves relating to the embodiment of FIG. 8a. It is noted that in FIG. 8d the curve labelled $11_1$ is the efficiency curve in a scale of 0 to 1, while the curve $11_2$ is the same efficiency curve but magnified to help illustrate its characteristics.

It is noted that further examples may be used for configuring four-stage and higher order amplifiers, using the same concepts as described above in the embodiments of the present invention.

Figure 9:
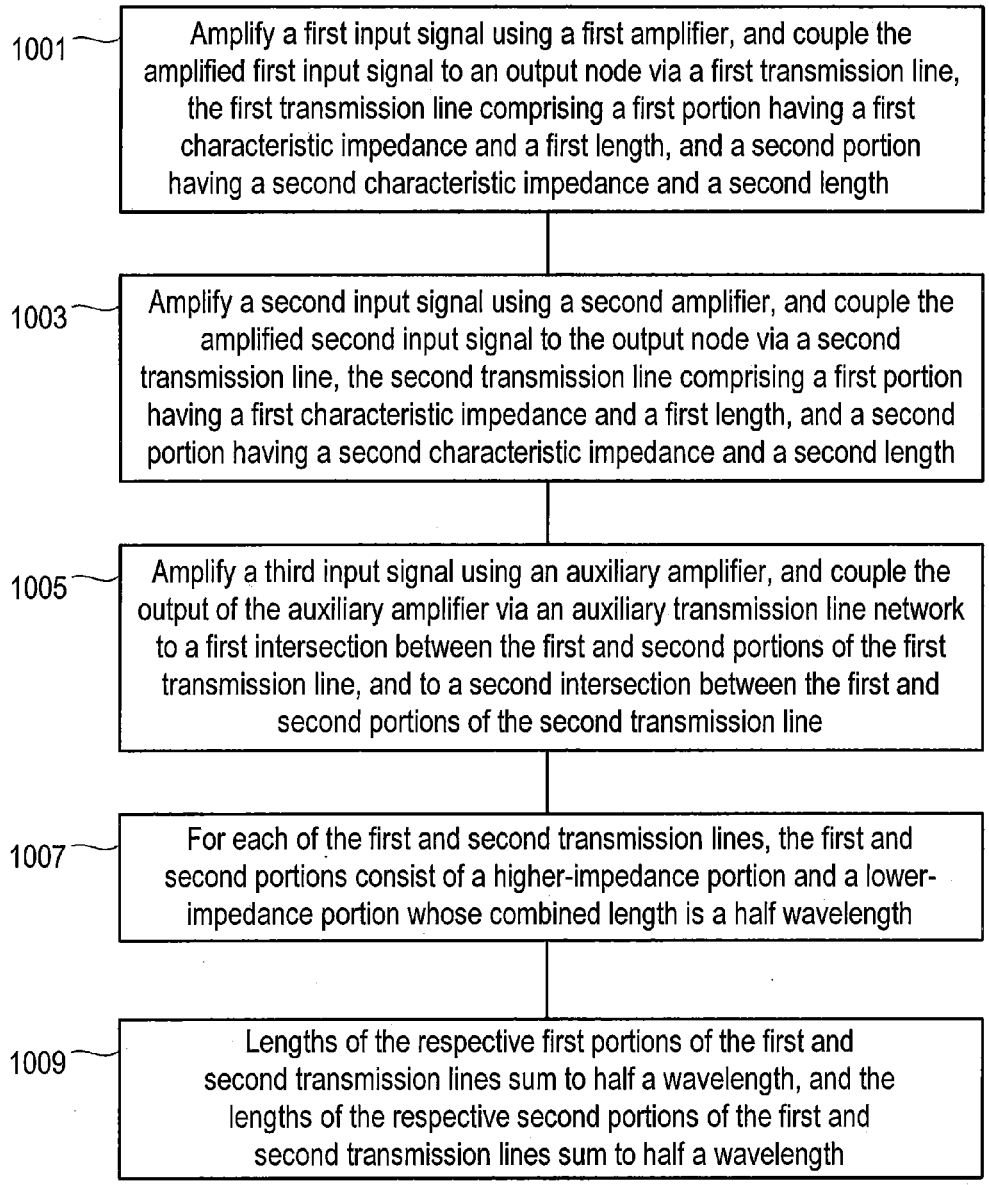
FIG. 9 shows the steps performed by a method according to an embodiment of the present invention.

FIG. 9 shows the steps performed in an amplifier circuit by a method according to another embodiment of the present invention.

The method comprises the steps of amplifying a first input signal 10 using a first amplifier 11, and coupling the amplified first input signal to an output node 15 via a first transmission line 13, the first transmission line 13 comprising a first portion 13₁ having a first characteristic impedance and a first length, and a second portion 13₂ having a second characteristic impedance and a second length, step 1001. The method further comprises the step of amplifying a second input signal 20 using a second amplifier, and coupling the amplified second input signal to the output node via a second transmission line, the second transmission line comprising a first portion having a first characteristic impedance and a first length, and a second portion having a second characteristic impedance and a second length, step 1003. The method further comprises the step of amplifying a third input signal 30 using an auxiliary amplifier, and coupling the output of the auxiliary amplifier via an auxiliary transmission line network to a first intersection between the first and second portions of the first transmission line, and to a second intersection between the first and second portions of the second transmission line, step 1005. For each of the first and second transmission lines, the first and second portions consist of a higher-impedance portion and a lower-impedance portion whose combined length is a half wavelength, step 1007. The lengths of the respective first portions of the first and second transmission lines sum to half a wavelength, and the lengths of the respective second portions of the first and second transmission lines sum to half a wavelength, step 1009.

Transistors in general act as controlled RF current sources, so the shape of the amplitudes and phases (relative to that of the output) of the RF currents as functions of the output amplitude also suggest the desired voltage shaping that can be performed to the input signals (gate drive voltages). The actual shapes can take into account that the voltage-to-current conversion (transconductance) in the transistors is more or less nonlinear, and that the RF voltage swing can influence the output current as well (especially via saturation when close to the upper limit).

It is noted that for all the transmission lines shown in the example embodiments above, these can be replaced by equivalent circuits such as combinations of lumped elements. For example, the quarter wave lines can be replaced by LC, pi- or T-networks with reactances equal in magnitude to the characteristic impedance of the replaced quarter wave line. T networks, L networks, single or in cascade can also be used, for example a line slightly shorter than a quarter wavelength can be synthesized by a quarter wavelength line with shunt inductors (coupled to RF ground) at each side, and a line longer than a quarter wavelength can be synthesized by a quarter wavelength line with shunt capacitors at each side.

The 3-stage amplifier circuits according to embodiments of the present invention offer close to optimal Chireix outphasing between all three amplifiers (sub-amplifiers) in the upper 9.5 dB amplitude range, with better than 99.9% linear model efficiency. The 4-stage amplifier circuits according to embodiments of the present invention have very good efficiency in wide amplitude ranges, also when different size sub-amplifier pairs are employed.

The amplifier circuits of the present invention are particularly suitable when transistors with very low shunt loss are employed, such as Laterally Diffused Metal Oxide Semiconductor (LDMOS) transistors at relatively low frequencies, or at higher frequencies with Gallium Nitride (GaN) or Gallium Arsenide (GaA) transistors.

In the embodiments described above, it is noted that a characteristic impedance of a first portion, e.g. 13₁ is higher that the characteristic impedance of a second portion, e.g. 13₂, of a transmission line, as represented by the relative thicknesses of the transmission lines (the smaller the thickness the higher the characteristic impedance, and vice versa. The characteristic impedance of a first portion of a first transmission line may be substantially N times the characteristic impedance of a second portion of the first transmission line and/or the characteristic impedance of a first portion of a second transmission line may be substantially N times the characteristic impedance of a second portion of a second transmission line.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single processor or other unit may fulfil the functions of several units recited in the claims. Any reference signs in the claims shall not be construed so as to limit their scope.

The invention claimed is:

1. An amplifier circuit comprising:
   a first amplifier configured to amplify a first input signal, wherein an output of the first amplifier is coupled to an output node via a first transmission line, the first transmission line comprising a first portion having a first characteristic impedance and a first length, and a second portion having a second characteristic impedance and a second length;
   a second amplifier configured to amplify a second input signal, wherein an output of the second amplifier is coupled to the output node via a second transmission line, the second transmission line comprising a first portion having a first characteristic impedance and a first length, and a second portion having a second characteristic impedance and a second length; and
   an auxiliary amplifier configured to amplify a third input signal, wherein an output of the auxiliary amplifier is coupled via an auxiliary transmission line network to a first intersection between the first and second portions of the first transmission line, and to a second intersection between the first and second portions of the second transmission line;
   wherein for each of the first and second transmission lines, the first and second portions consist of a higher-impedance portion and a lower-impedance portion whose combined length is a half wavelength; and
   wherein the lengths of the respective first portions of the first and second transmission lines sum to half a wavelength, and the lengths of the respective second portions of the first and second transmission lines sum to half a wavelength.

2. An amplifier circuit as claimed in claim 1, wherein the length of the first portion of the first transmission line is substantially equal to the length of the second portion of the second transmission line and/or wherein the length of the first portion of the second transmission line is substantially equal to the length of the second portion of the first transmission line.

3. An amplifier circuit as claimed in claim 1, wherein the auxiliary transmission line network comprises first and second auxiliary transmission lines for coupling the auxiliary amplifier to the first and second intersections of the first and second transmission lines, and wherein the length of each of the first and second auxiliary transmission lines is three quarters of a wavelength minus the length of the second portion of the respective transmission line which connects the auxiliary transmission line to the output.

4. An amplifier circuit as claimed in claim 1, wherein the total length from the auxiliary amplifier to the output through any path is equal to three quarter wavelengths.

5. An amplifier circuit as claimed in claim 1, wherein the first amplifier, second amplifier and auxiliary amplifier are of substantially the same size.

6. An amplifier circuit as claimed in claim 1, wherein the first amplifier and second amplifier are of substantially the same size, and the auxiliary amplifier reduced in size compared to the first and second amplifiers.

7. An amplifier circuit as claimed in claim 6, wherein the auxiliary amplifier is reduced in size by about 80% compared to the first and second amplifiers.

8. An amplifier circuit as claimed in claim 1, wherein the auxiliary amplifier is coupled directly or by a half wavelength transmission line to the auxiliary transmission line network.

9. An amplifier circuit as claimed in claim 1, wherein the auxiliary amplifier comprises first and second auxiliary amplifiers, and wherein the first auxiliary amplifier is coupled via a first auxiliary transmission line to an auxiliary junction, and the second auxiliary amplifier coupled via a second auxiliary transmission line to the auxiliary junction.

10. An amplifier circuit as claimed in claim 9, wherein the length of the first auxiliary transmission line and the third auxiliary transmission line sum to half a wavelength.

11. An amplifier circuit as claimed in claim 9, wherein the first amplifier, second amplifier, first auxiliary amplifier and second auxiliary amplifier are of substantially the same size.

12. An amplifier circuit as claimed in claim 9, wherein the first amplifier and second amplifier are of substantially the same size, and wherein the first auxiliary amplifier and second auxiliary amplifier are of substantially the same size but smaller than the first and second amplifiers.

13. An amplifier circuit as claimed in claim 12, wherein the first auxiliary amplifier and second auxiliary amplifier are about 80% of the size of the first and second amplifiers.

14. An amplifier circuit as claimed in claim 9, wherein the first amplifier and second amplifier are of substantially the same size, and wherein the first auxiliary amplifier and second auxiliary amplifier are of substantially the same size but larger than the first and second amplifiers.

15. An amplifier circuit as claimed in claim 14, wherein the first amplifier and second auxiliary amplifier are about 50% of the size of the first and second auxiliary amplifiers.

16. An amplifier circuit as claimed in claim 1, further comprising a fourth amplifier configured to amplify a fourth input signal, wherein an output of the fourth amplifier is coupled either directly to the output node, or via a half wavelength transmission line or multiple thereof.

17. A method in an amplifier circuit, the method comprising:
   amplifying a first input signal using a first amplifier, and coupling the amplified first input signal to an output node via a first transmission line, the first transmission line comprising a first portion having a first characteristic impedance and a first length, and a second portion having a second characteristic impedance and a second length;
   amplifying a second input signal using a second amplifier, and coupling the amplified second input signal to the output node via a second transmission line, the second transmission line comprising a first portion having a first characteristic impedance and a first length, and a second portion having a second characteristic impedance and a second length; and
   amplifying a third input signal using an auxiliary amplifier, and coupling the output of the auxiliary amplifier via an auxiliary transmission line network to a first intersection between the first and second portions of the first transmission line, and to a second intersection between the first and second portions of the second transmission line
   wherein for each of the first and second transmission lines, the first and second portions consist of a higher-impedance portion and a lower-impedance portion whose combined length is a half wavelength; and
   wherein the lengths of the respective first portions of the first and second transmission lines sum to half a wavelength, and the lengths of the respective second portions of the first and second transmission lines sum to half a wavelength.

\* \* \* \* \*